United States Patent
In et al.

(10) Patent No.: US 7,196,590 B1
(45) Date of Patent: Mar. 27, 2007

(54) MULTI-FREQUENCY SYTHESIS USING SYMMETRY IN ARRAYS OF COUPLED NONLINEAR OSCILLATORS

(75) Inventors: Visarath In, Chula Vista, CA (US); Yong (Andy) Kho, San Diego, CA (US); Joseph D. Neff, San Diego, CA (US); Brian K. Meadows, San Diego, CA (US); Patrick Longhini, Rancho Bernardo, CA (US); Antonio Palacios, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/874,010

(22) Filed: Jun. 18, 2004

(51) Int. Cl.
*H03K 3/03* (2006.01)

(52) U.S. Cl. .............................................. 331/53; 331/2

(58) Field of Classification Search ................ 331/2, 331/45, 46, 53
See application file for complete search history.

(56) References Cited

U.S. PATENT DOCUMENTS

| | | | | |
|---|---|---|---|---|
| 5,625,324 A | * | 4/1997 | Hsu et al. ...................... | 331/2 |
| 5,789,961 A | * | 8/1998 | Bulsara et al. ................ | 331/56 |
| 6,104,253 A | * | 8/2000 | Hall et al. .................... | 331/56 |
| 6,137,369 A | * | 10/2000 | Kermani ...................... | 331/45 |
| 6,657,502 B2 | * | 12/2003 | Bushman et al. ............. | 331/57 |

* cited by examiner

*Primary Examiner*—Robert Pascal
*Assistant Examiner*—James Goodley
(74) *Attorney, Agent, or Firm*—Peter A. Lipovsky; Michael A. Kagan; Allan Y. Lee

(57) ABSTRACT

Certain spatio-temporal symmetries induce one array of a two-array coupled network of oscillators to oscillate at N times the frequency of the other array, where N is the number of oscillators in each array.

11 Claims, 8 Drawing Sheets

| FIG.4A | FIG.4B |
| --- | --- |
| FIG.4C | FIG.4D |

US 7,196,590 B1

MULTI-FREQUENCY SYTHESIS USING SYMMETRY IN ARRAYS OF COUPLED NONLINEAR OSCILLATORS

BACKGROUND

The ability to generate multi-frequencies from a single network system is desirable for many applications in communication systems. Specifically suitable are those communication systems where operation modes require switching from one frequency to another in order to be in a desirable channel. Example applications of this include, but are not limited to, large array radar, phase array antenna, sonar arrays, and other multi-mode communication devices.

SUMMARY

Certain spatio-temporal symmetries induce one array of a two-array coupled network of oscillators to oscillate at N times the frequency of the other array, where N is the number of oscillators in each array.

Other objects, advantages and new features of the invention will become apparent from the following detailed description of the invention when considered in conjunction with the accompanied drawings.

DESCRIPTION

The generation of multi-frequency oscillations in networks of two coupled, nonlinear oscillator arrays is detailed in the ensuing description.

Theoretical works in coupled oscillators have lead to the observation of particular patterns of oscillations; where one or more oscillators oscillate at different frequencies, see for example, bibliography references [1, 3, 4, 2] cited at the end of this description.

Central to the works mentioned above is the use of symmetry in a systematic way. "Systematic" meaning the group theoretical approach developed by Golubitsky to study symmetric systems, see for example, bibliography references [8, 6, 2, 7]. Herein, symmetry in a systematic way is used to identify certain multi-frequency patterns that are not readily apparent through standard theory of synchronization or frequency entrainment, see for example, bibliography reference [9].

According to the description herein, multi-frequency patterns are realized electronically in a circuit that serves as a model for a network of two arrays that are coupled to one another, with N oscillators per array. A particular pattern is demonstrated where in-phase oscillators in one array are induced to oscillate at N times the frequency of the other array. The results are considered model-independent, meaning that they apply to a very broad class of oscillatory systems regardless of the intrinsic dynamics of the oscillators used. The model circuit given by way of example here is based upon equations describing coupled, bistable, overdamped Duffing oscillators.

Following for example Buono et al [3] cited above as well as, for example, related bibliographical works [10, 11, 2, 12], the internal-dynamics of each individual oscillator is assumed to be governed by a k-dimensional continuous-time system of differential equations of the form:

$$\frac{dX_i}{dt} = f(X_i, \lambda), \quad (1)$$

where $X_i = (x_{i1}, \ldots, x_{ik}) \in R^k$ denotes the state variables of oscillator i and $\lambda$ is a vector of parameters. The frequency (f) is independent of i as the oscillators are assumed to be substantially identical. In this description, a network of N oscillators is a collection of N substantially identical interconnected/coupled nonlinear oscillators, which can be modeled by the following system of coupled differential equations:

$$\frac{dX_i}{dt} = f(X_i) + \sum_{j \to i} c_{ij} h(X_i, X_j), \quad (2)$$

where h is the coupling function between two oscillators, the summation is taken over those oscillators j that are coupled to oscillator i, and $c_{ij}$ is a matrix of coupling strengths.

Figure 1:
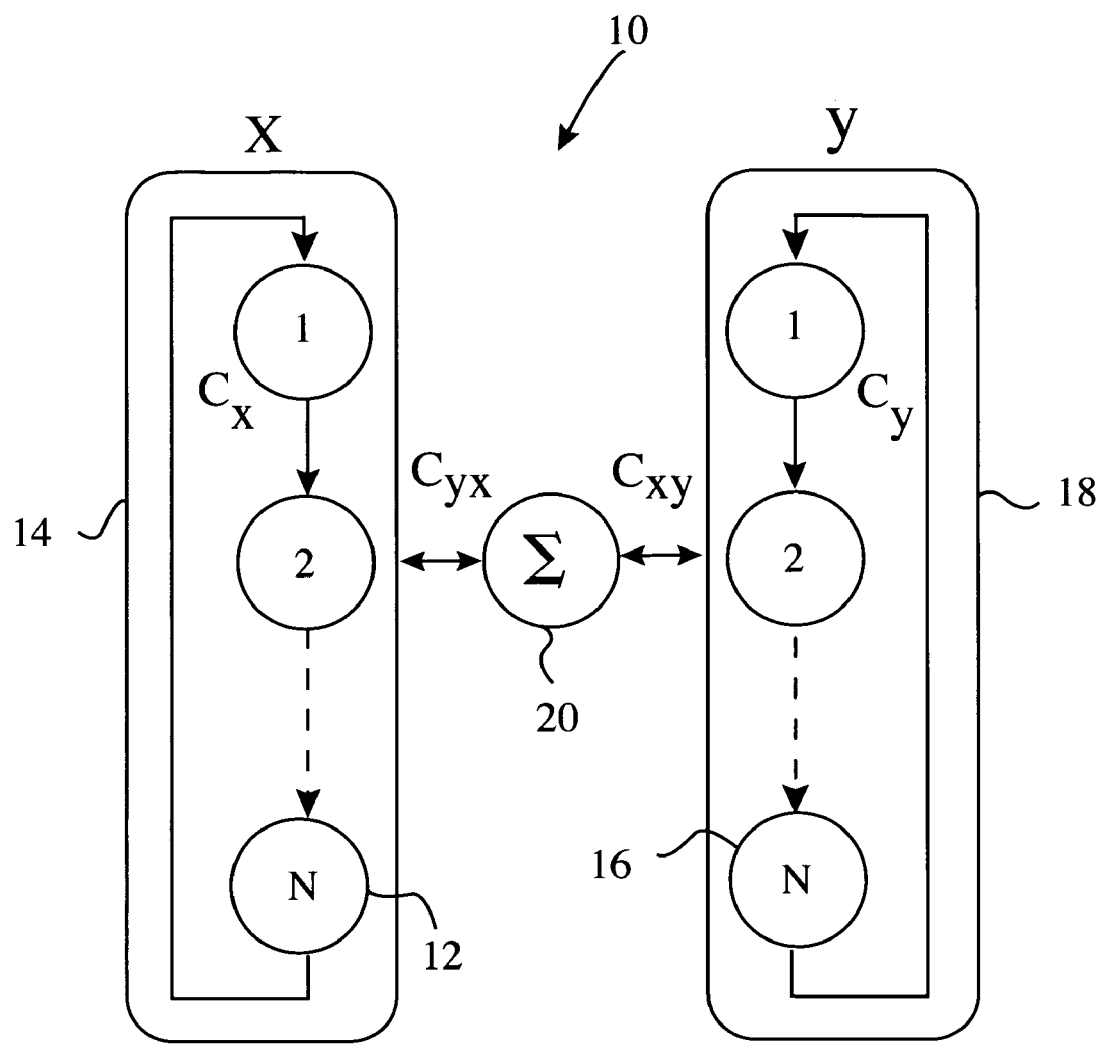
FIG. 1 is a schematic diagram of a two-array network of coupled nonlinear oscillators having N oscillators per array.

FIG. 1 shows an example network 10 where $c_{xy}$ ($c_{yx}$) is a specific coupling implementation. To study network 10's collective behavior, $X(t)=(X_1(t), \ldots, X_N(t))$ is used to represent the state of oscillators 12 of first array 14, and $Y(t)=(Y_1(t), \ldots, Y_N(t))$ for that of oscillators 16 of second array 18. At any given time, the state of the entire network is described by $(X(t), Y(t))$.

Characteristics of this example implementation are traveling wave (TW) patterns, i.e., periodic oscillations of period T with identical waveform but with a constant phase shift, $\Phi=T/N$, among nearest neighboring oscillators; and in-phase (IP) oscillations of the same period T (nearest neighbors being, e.g., oscillators $x_{i-1}$, $x_i$ and $x_{i+1}$). For example, $P_1(t)=(X_{TW}(t), Y_{IP}(t))$ describes a collective pattern (P) where left-hand array 14 oscillates in a TW fashion, $X_{TW}(t)=(X_1(t), X_1(t-\Phi), \ldots, X_N(t-(N-1)\Phi)))$, while right-hand array 18 oscillates in-phase, $Y_{IP}(t)=(Y_1(t), \ldots, Y_N(t))$, and $Y_i(t)=Y_j(t)$.

The amount of symmetry of these and other similar patterns is described by the set of spatial and temporal transformations that leave them unchanged. Together, these transformations form the group of symmetries of the pattern. It is to be noted here that certain groups of symmetries are associated with periodic patterns where an entire array oscillates at different frequencies. For example, assume that the pattern $P_1=(X_{TW}(t), Y_{IP}(t))$ has symmetry group $(Z_N \times S^1) \times (Z_N \times S^1)$, which describes (simultaneous) cyclic permutations of the oscillators in each array, accompanied by shifts in time by $\Phi$. Then a direct exercise, bibliography reference [2], shows that these two operations leave the traveling wave unchanged but the in-phase oscillators are shifted in time by $\Phi$. That is, $(Z_n \times S^1) \cdot X_{TW}(t) = X_{TW}(t)$ and $(Z_n \times S^1) \cdot Y_{IP}(t) = Y_{IP}(t+\Phi)$. Thus if $(Z_N \times S^1) \times (Z_N \times S^1)$ is the symmetry group of $P_1(t)$, then $(Z_n \times S^1)) \times (Z_N \times S^1) \cdot P_1(t) = P_1(t)$, which implies that $Y_{IP}(t) = Y_{IP}(t+\Phi)$. Accordingly, the in-phase pattern must oscillate at N times the frequency of the traveling wave pattern.

This is illustrated herein by a system of coupled over-damped Duffing oscillators, using both numerical simulations and measurements from electronic circuits. Two different interconnection (coupling) schemes are considered separately, depending on whether N is odd or even. In the odd case, the oscillators of each array are unidirectionally coupled (one-way signal flow) to their nearest neighbors, i.e. oscillator $x_i$ is coupled to oscillators $x_{i+1}$ and $x_{i-1}$, for example. Use of periodic boundary conditions causes the final oscillator of the array to be coupled to the first. When N is even, however, non-nearest neighbor oscillators of an array are additionally coupled to one another to meet the conditions for Hopf bifurcations, see for example, bibliography reference [4].

In both instances, these Hopf bifurcations lead the arrays to oscillate, and consequently, permit the multi-frequency pattern to be observed. Periodic boundary conditions are used in this embodiment as well wherein the first oscillator of the array is coupled to the last oscillator of the array. In both odd and even N cases, the arrays are then interconnected to one other via sums of outputs—as is shown generally by summer 20 of FIG. 1. The resulting network then can be modeled by a system of differential equations of the form:

$$\dot{x}_i = \lambda_x x_i - x_i^3 + c_x(x_i - x_{i+1}) + c_{xy} \sum_{i=1}^{N} y_i \quad (3)$$

$$\dot{y}_i = \lambda_y y_i - y_i^3 + c_y(y_i - y_{i+1}) + c_{yx} \sum_{i=1}^{N} x_i,$$

where $x_i$ ($y_i$) are the state variables of the left-hand (right-hand) arrays, $\lambda_x$ ($\lambda_y$) is a parameter that controls the local dynamics of each oscillator in the left-hand (right-hand) array, $c_x$ ($c_y$) is the coupling strengths for connections in the X (Y) array, and $c_{xy}$ is the cross-coupling strength between the X- and Y-arrays. The coupling function h of equation (2) is $x_i - x_{i+1}$ for the X-array and is $y_i - y_{i+1}$ for the Y-array. A linear stability analysis reveals that each array is capable of oscillating on its own, i.e., when $c_{xy} = 0$ ($c_{yx} = 0$), via a Hopf bifurcation at $\lambda_x = -(3/2)c_x$ or $\lambda_y = -(3/2)c_y$.

Figure 2:
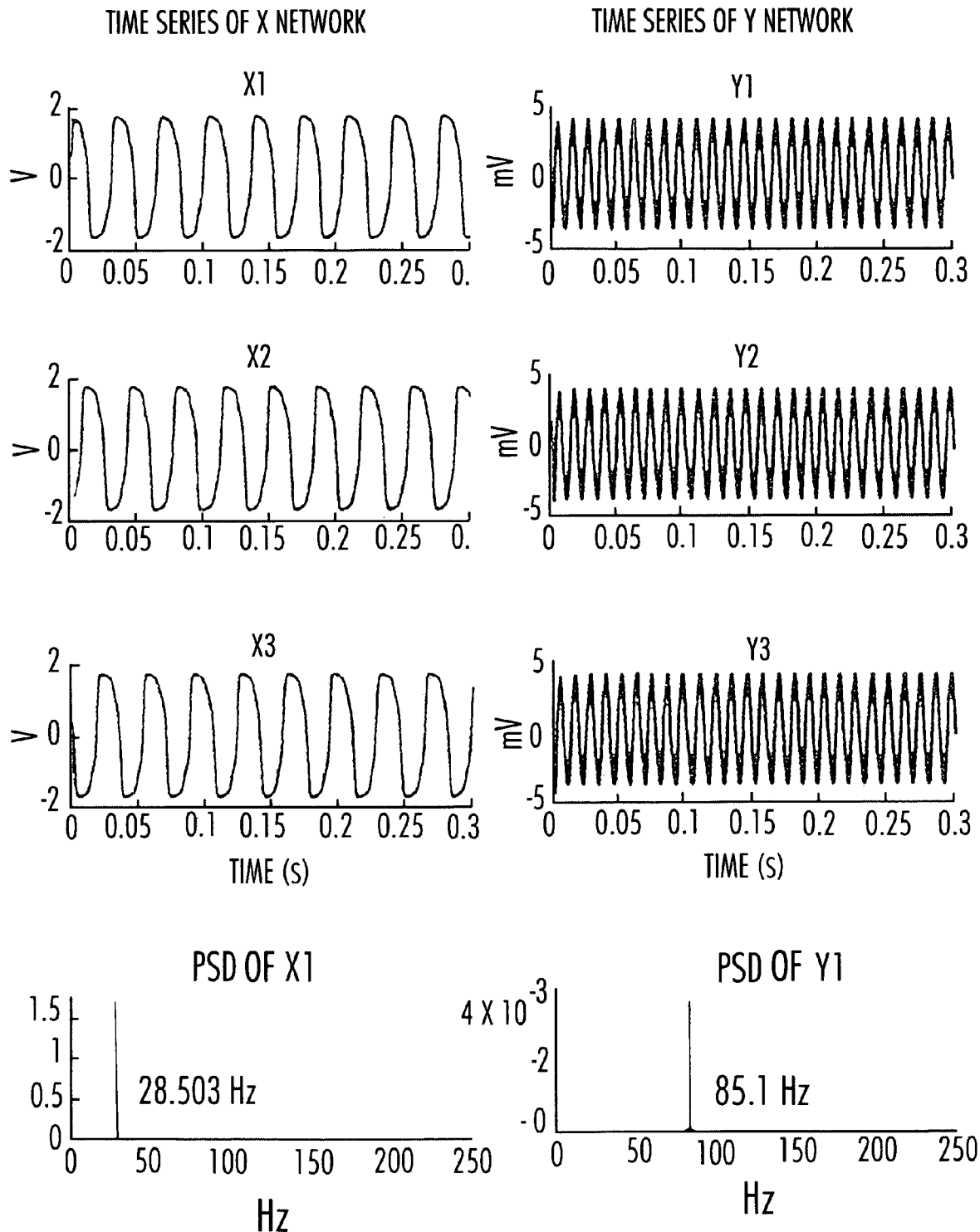
FIG. 2 illustrates graphically numerical simulations of an operating example system according to the description herein.

FIG. 2 depicts numerical simulations showing the results of integrating the model equations (3) with N=3 oscillators per array. Initial conditions and parameters are: $X_0 = (1.78, -0.85, -0.08)$, $Y_0 = (0.99, 0.99, 0.99)$, $c_x = c_y = 2.6$, $c_{xy} = 0.01$, and $\lambda_x = \lambda y = 0.02$. As predicted by theory, the in-phase oscillations of the right-hand (Y) array are N=3 times faster than those of the traveling wave of the left-hand (X) array. In FIG. 2, the frequency spectrum (bottom graph) confirms this relationship. Further simulations with larger arrays (N>3) have shown like multi-frequency patterns.

Figure 3:
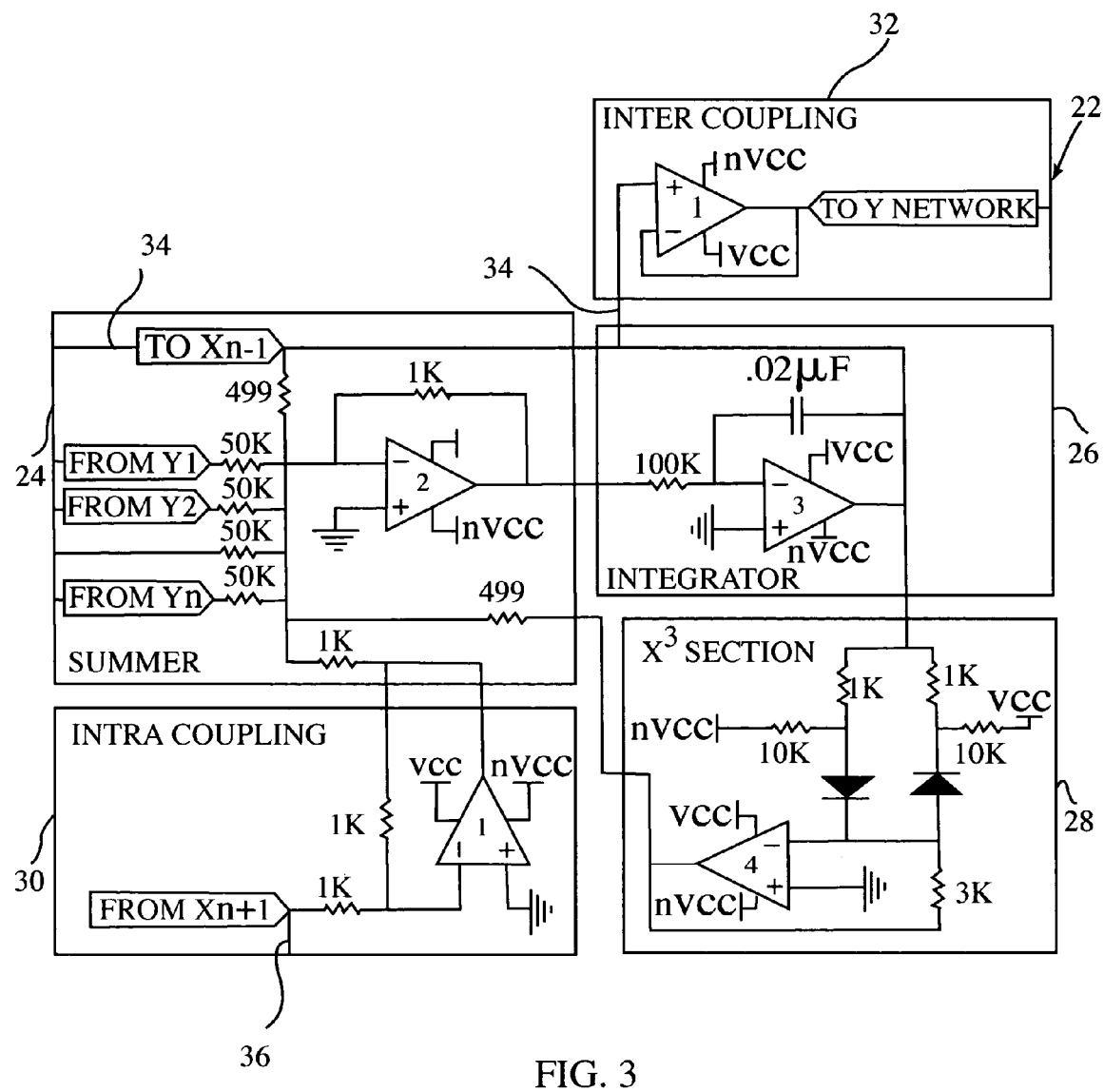
FIG. 3 shows an exemplary electronic circuit diagram of a unit oscillator as may be used according to the description herein.

Referring now to FIG. 3, an example electronic implementation of Eq. (3) is illustrated. Shown generally is a unit oscillator 22 which lends itself to mass production. Unit 22 incorporates a number of operational amplifiers (e.g. LM348N by National Semiconductor), which are employed to individually act as a summing-inverting amplifier (summer) 24, an integrator 26, and as a producer of nonlinear equation terms 28 (implemented as a piece-wise linear function). Intra-coupling element 30 provides for unidirectional coupling between oscillators of an array and contributes to the linear terms of the equation. Also depicted is an inter-coupling element 32 as may be used to cross couple one array output to the other. Oscillator output 34 and input 36 are additionally depicted in this figure. Example values of the components used in this unit oscillator are given in the figure.

Figure 4A:
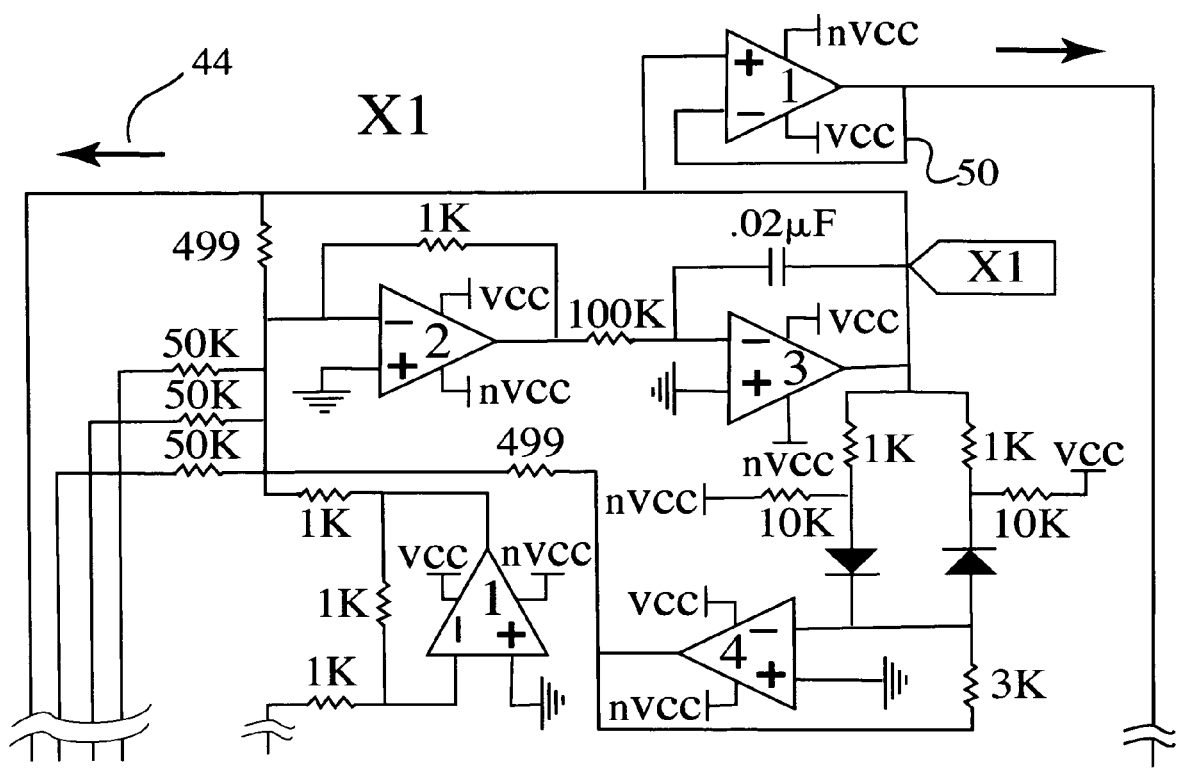
FIG. 4 shows an exemplary system according to the description herein incorporating two coupled arrays of oscillators.
Figure 4B:
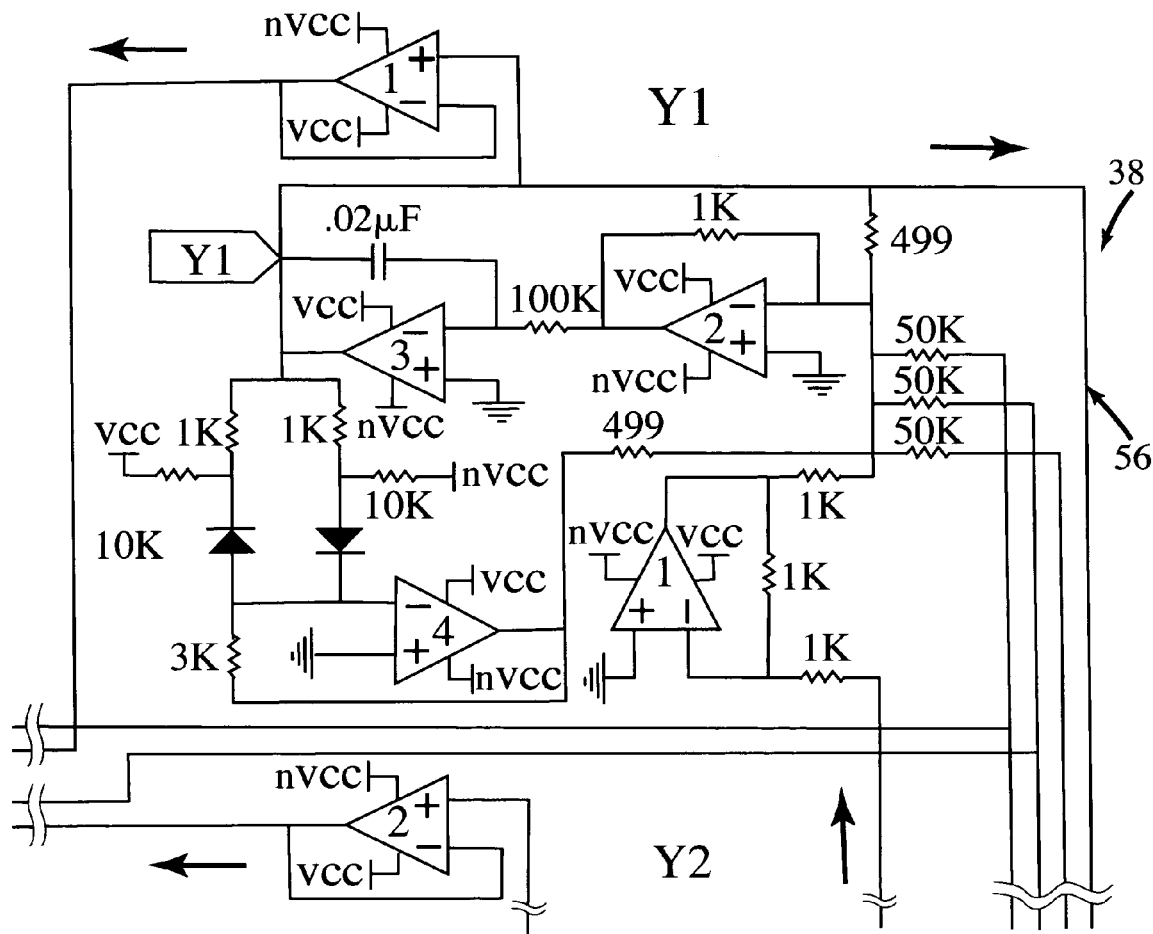
Figure 4C:
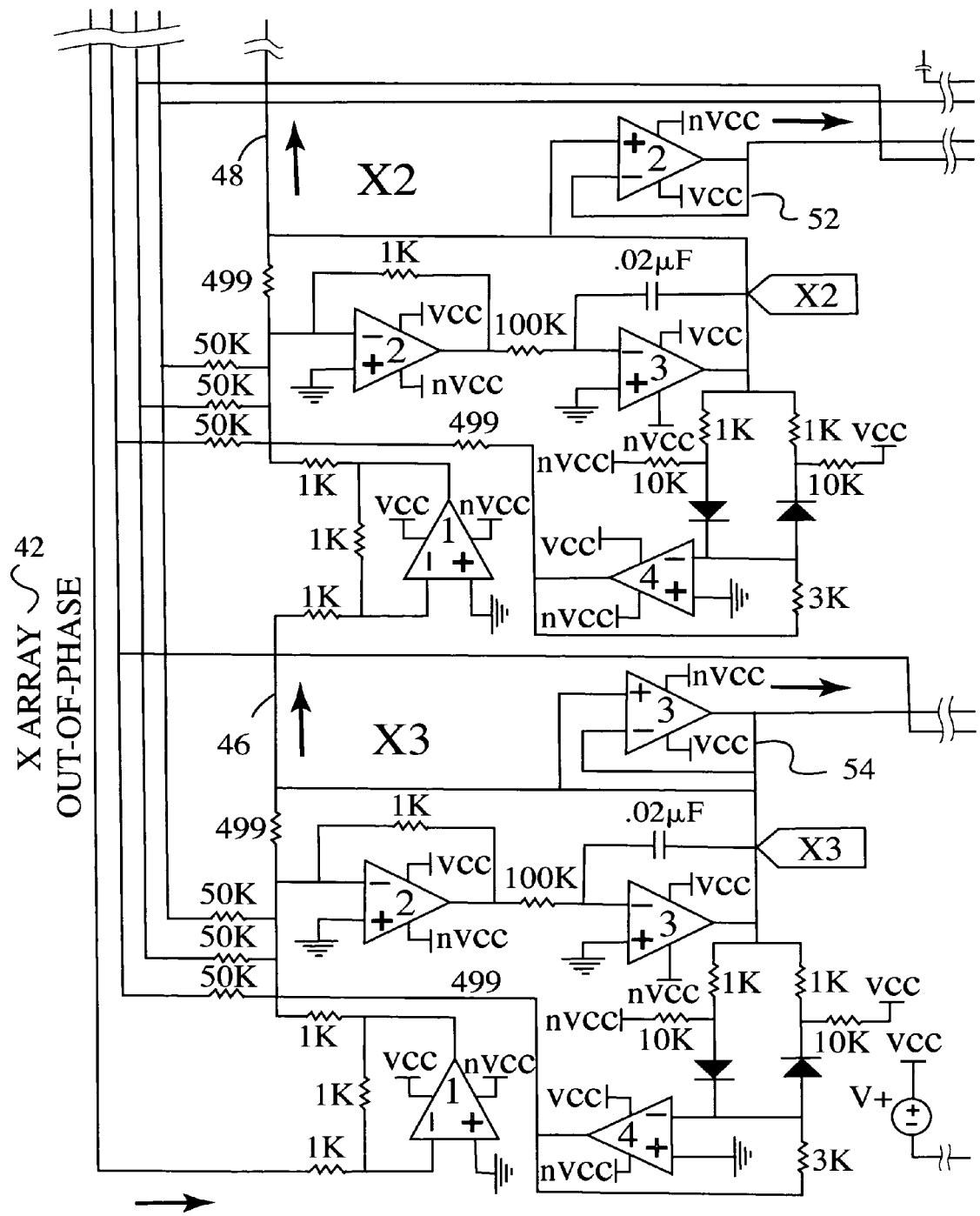
Figures 4, 4D:
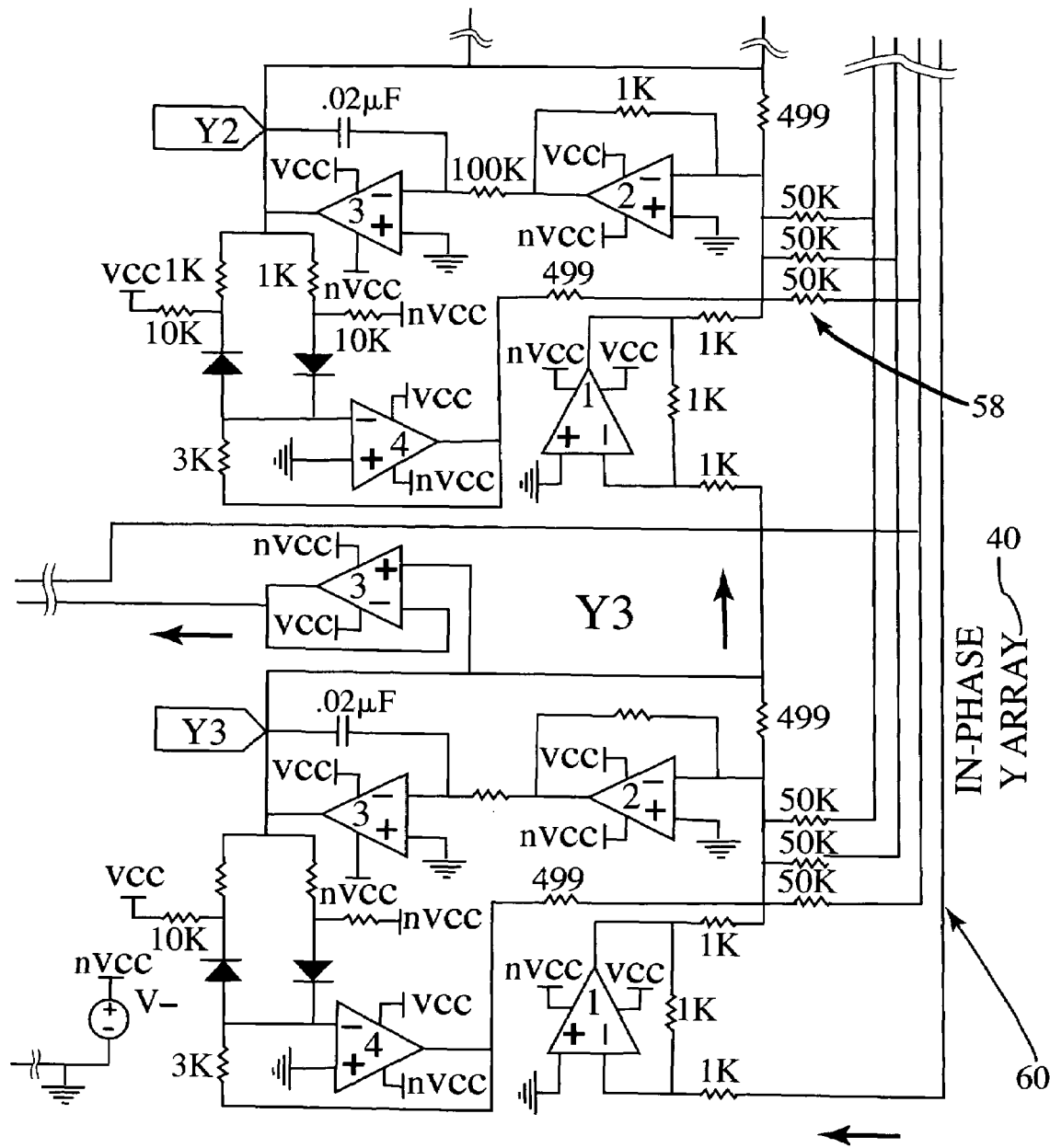

Referring now to FIG. 4, an example network 38 includes two arrays 40 and 42 each of which include three intra-coupled unit-oscillators, shown as Y1–Y3 and X1–X3, respectively. These arrays form two 1×3 columns also identified in the figure as the X and Y-arrays.

Referring now to the example of X-Array 42, it can be seen that oscillator output 44 of oscillator X1 flows in one direction to become an oscillator input to oscillator X3. Similarly, oscillator output 46 becomes an input to oscillator X2 and oscillator output 48 becomes an input to oscillator X1. These connections provide an intra-coupling network for X-array 42.

Inter-coupling elements 50, 52 and 54 provide outputs from the respective X1, X2 and X3 oscillators that are each connected as inputs to the summers 56, 58 and 60 of oscillators Y1, Y2 and Y3, respectively, to provide summed oscillator inputs to these Y oscillators.

From FIG. 4 it is apparent that the functional relationship described between array 42 and array 40 is reflectively the same as between array 40 and array 42.

In the reduction to practice of network 38, attempts were made to match the parameters between the hard-wire and numerical systems. Even though they differed, it was found that the precise matching was not necessary to achieve the desired resulting pattern.

Upon first connecting power to the network, both the X-array and Y-array tended to oscillate at the same frequency but both in a traveling wave state, i.e., each oscillator in each array shifted in phase from its neighbor by T/3, where T is the mutual period of oscillation. This pattern represents one of the many possible solutions that can be found merely by investigating the symmetry properties of the system. This particular solution is apparently favored as a result of the power-up initial conditions, i.e. in its basin of attraction.

To get only one array to oscillate in-phase, such as the Y-array, the initial conditions (or state) of the array were changed. This can be done by briefly pinning the voltage at Y1, Y2, or Y3 with a separate power supply, see FIG. 4. In practice, Y1 was momentarily set to 1.7 volts after which the Y-array became induced into its in-phase state. The state is stable and self-sustaining. To guard against parasitic coupling between the arrays, each array is provided with its own power regulator (not shown).

In the array network demonstrated, the nominal (traveling wave oscillations) frequency was approximately 28.44 Hz. It was found that when one of the arrays was induced to operate in the in-phase state, the oscillations in that array became 3 times (approximately 85.27 Hz) the nominal frequency. Providing that the symmetry conditions described above are met, one can envision such a network to generate frequencies of $1\omega$ to $N\omega$, where N is the number of oscillators in each array and $\omega$ is the array nominal angular frequency.

Figure 5:
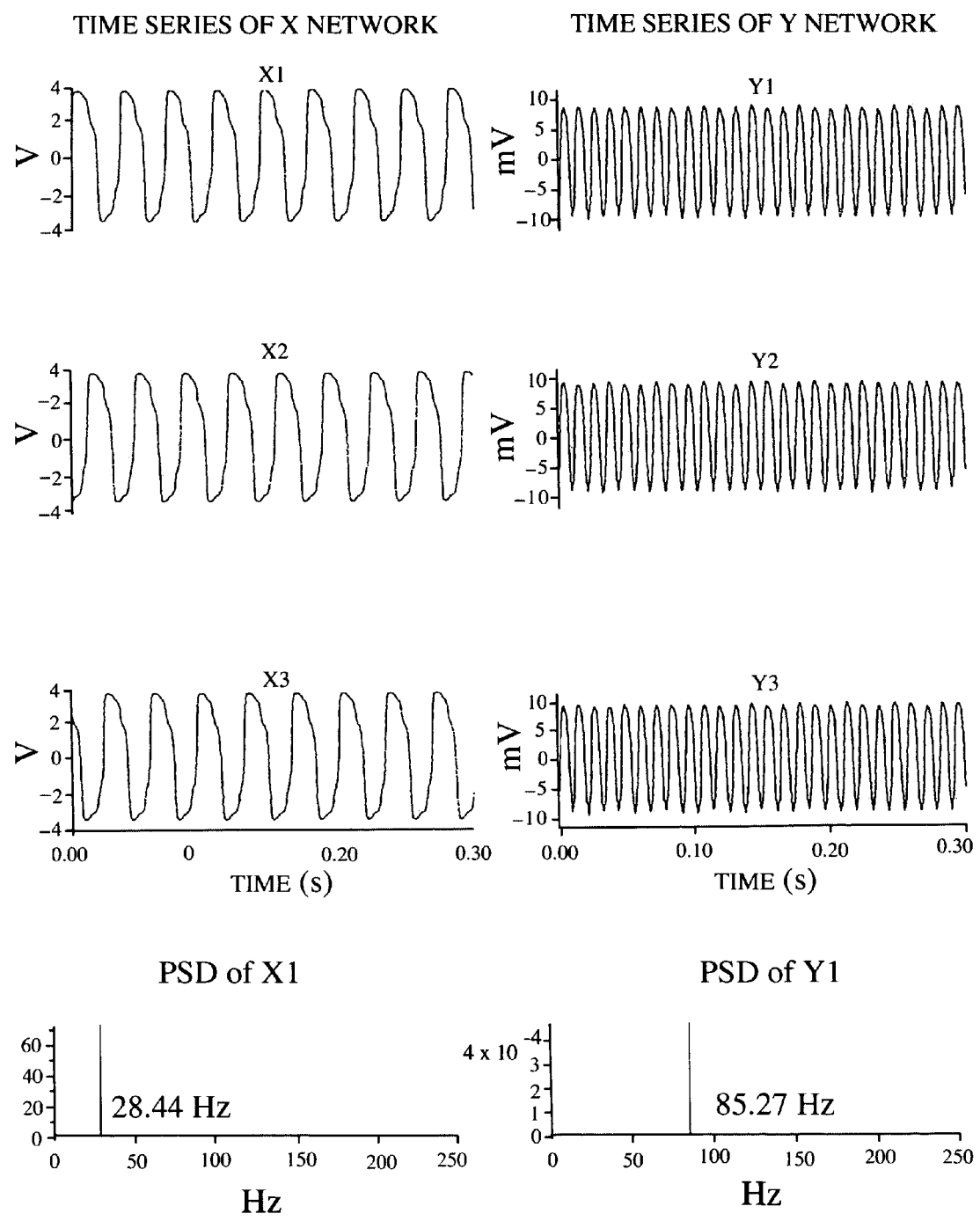
FIG. 5 depicts in graphical form voltage measurements of the example system shown in FIG. 1.

Referring to the voltage measurements of FIG. 5, the left column of this figure shows the traveling wave dynamics of oscillators X1, X2, and X3 in X-array 42 of FIG. 4. The right column shows the dynamics of the corresponding oscillators Y1, Y2, and Y3 in Y-array 40. The graphs at the bottom of this figure depict the power spectral density plots of the corresponding time series represented in each column. The bottom right graph clearly illustrates that the Y-array is oscillating, within experimental error, at three times the oscillation of the X-array. As is the case in the numerical simulations, the multi-frequency behavior occurs within a certain window in parameter space.

Bibliography

[1] D. Armbruster and P. Chossat, *Phys. Lett. A* 254, 269 (1999).

[2] M. Golubitsky and I. Stewart, *Geometry, Mechanics, and Dynamics*, edited by P. Newton, P. Holmes, and A. Weinstein, Springer, New York, 243 (2002).

[3] P. L. Buono, M. Golubitsky, and A. Palacios, *Physica D*. 143 74 (2000).

[4] M. Golubitsky and I. Stewart, "Hopf bifurcation with dihedral group symmetry", edited by M. Golubitsky and J. Guckenheimer, *AMS Contemporary Mathematics* 56, Springer, New York, 131 (1986).

[6] M. Golubitsky and I. Stewart, "Symmetry and pattern formation in coupled cell networks", edited by M. Golubitsky, D. Luss and S. H. Strogatz, *IMA Volumes in Mathematics and its Applications* 115 Springer, New York, 65 (1999).

[7] M. Golubitsky, I. N. Stewart, and D. G. Schaeffer. "Singularities and Groups in Bifurcation Theory: Vol. II." *Appl. Math. Sci.* 69 Springer-Verlag, New York, 1988.

[8] M. Golubitsky, M. Nicol, and I. Stewart, *J. Nonlinear Sci*. Submitted (2003).

[9] A. Pikovsky, M. Rosenblum, and J. Kurths, "Synchronization. A universal concept in nonlinear sciences", *Cambridge Nonlinear Science Series* 12 Cambridge University Press, United Kingdom, 2001.

[10] B. Dionne, M. Golubitsky, and I. Stewart, *Nonlinearity* 9 559 (1996).

[11] I. Epstein and M. Golubitsky, *Chaos*. 3 No. 1, 1 (1995).

[12] M. Golubitsky, I. N. Stewart, P-L. Buono, and J. J. Collins, *Physica D* 115 56 (1998).

Obviously, many modifications and variations of the invention are possible in light of the above description. It is therefore to be understood that within the scope of the appended claims, the invention may be practiced otherwise than as has been specifically described.

What is claimed is:

1. An apparatus comprising:
a first oscillator array including a first plurality of N nonlinear oscillators each having an oscillator input and an oscillator output and each having a summer operably coupled to provide a summed oscillator input, said first oscillator array also including a first intra coupling network to couple said oscillators so that each said oscillator output is coupled to at least one other nonlinear oscillator in said first plurality of N nonlinear oscillators;
a second oscillator array including a second plurality of N nonlinear oscillators each having an oscillator input and an oscillator output and each having a summer operably coupled to provide a summed oscillator input, said second oscillator array also including a second intra coupling network to couple said oscillators so that each said oscillator output is coupled to at least one other said nonlinear oscillator in said second plurality of N nonlinear oscillators; and an inter array coupling network coupling said oscillators of said first plurality of N nonlinear oscillators to said second plurality of N nonlinear oscillators so that each oscillator output of said first oscillator array is provided as an input to the respective said summer of each nonlinear oscillator of said second oscillator array and so that each oscillator output of said second oscillator array is provided as an input to the respective said summer of each nonlinear oscillator of said first oscillator array, wherein an oscillation frequency generated in one of said arrays generates a frequency-multiplied oscillation frequency in the other of said arrays that is substantially N times said oscillation frequency of said one array.

2. The apparatus of claim 1 wherein said nonlinear oscillators are substantially identical nonlinear oscillators.

3. The apparatus of claim 1 wherein each of said nonlinear oscillators includes an over-damped Duffing oscillator.

4. The apparatus of claim 3 wherein each of said nonlinear oscillators is a substantially identical over-damped Duffing oscillator.

5. The apparatus of claim 4 wherein N is an odd number.

6. The apparatus of claim 5 wherein each intra array coupling network provides one-way signal flow between said oscillators in said array.

7. The apparatus of claim 1 wherein said nonlinear oscillators are chosen from the group of magnetic sensors, ferro-electric sensors, piezo-electric sensors, superconducting-quantum interference device sensors, gyroscope sensors, voltage-controlled oscillators and phase-locked loops.

8. An apparatus comprising:
a first oscillator array including a first plurality of N substantially identical nonlinear oscillators each having an oscillator input and an oscillator output and each having a summer operably coupled to provide a summed oscillator input, said first oscillator array also including a first intra coupling network to couple said oscillators so that each said oscillator output is coupled to at least one other said nonlinear oscillator in said first plurality of N nonlinear oscillators, said coupling including one-way signal flow between said oscillators in said first plurality of N nonlinear oscillators;
a second oscillator array including a second plurality of N substantially identical nonlinear oscillators each having an oscillator input and an oscillator output and each having a summer operably coupled to provide a summed oscillator input, said second oscillator array also including a second intra coupling network coupling said oscillators so that each said oscillator output is coupled to at least one other said nonlinear oscillator in said second plurality of N nonlinear oscillators, said coupling including one-way signal flow between said oscillators in said second plurality of N nonlinear oscillators; and
an inter array coupling network coupling said oscillators of said first plurality of N nonlinear oscillators to said second plurality of N nonlinear oscillators so that each oscillator output of said first oscillator array is provided as an input to the respective said summer of each nonlinear oscillator of said second oscillator array and so that each oscillator output of said second oscillator array is provided as an input to the respective said summer of each nonlinear oscillator of said first oscillator array, wherein an oscillation frequency generated in one of said arrays generates a frequency-multiplied oscillation frequency in the other of said arrays that is substantially N times said oscillation frequency of said one array.

9. The apparatus of claim 8 wherein each of said nonlinear oscillators is an over-damped Duffing oscillator.

10. The apparatus of claim 9 wherein N is an odd number.

11. The apparatus of claim 8 wherein said nonlinear oscillators are chosen from the group of magnetic sensors, ferro-electric sensors, piezo-electric sensors, superconducting-quantum interference device sensors, gyroscope sensors, voltage-controlled oscillators and phase-locked loops.

* * * * *